US005715063A

United States Patent [19]

Ota

[11] Patent Number: 5,715,063
[45] Date of Patent: Feb. 3, 1998

[54] PROJECTION EXPOSURE METHOD

[75] Inventor: Kazuya Ota, Tokyo, Japan

[73] Assignee: Nikon Corporation, Tokyo, Japan

[21] Appl. No.: 649,484

[22] Filed: May 17, 1996

[30] Foreign Application Priority Data

May 24, 1995 [JP] Japan .................................. 7-124791

[51] Int. Cl.$^6$ .................................................. G01B 11/00
[52] U.S. Cl. .................................. 356/400; 356/399
[58] Field of Search .................................. 356/399–401;
250/548; 430/322, 312, 22, 5; 355/53, 55, 43

[56] References Cited

U.S. PATENT DOCUMENTS

| | | | |
|---|---|---|---|
| 4,780,617 | 10/1988 | Umatate et al. | 250/548 |
| 5,117,255 | 5/1992 | Shiraishi et al. | 355/53 |
| 5,138,176 | 8/1992 | Nishi | 250/548 |
| 5,448,332 | 9/1995 | Sakakibara et al. | 355/53 |
| 5,448,333 | 9/1995 | Iwamoto et al. | 355/53 |
| 5,489,986 | 2/1996 | Magome et al. | 356/401 |
| 5,493,402 | 2/1996 | Hirukawa | 356/400 |
| 5,521,036 | 5/1996 | Iwamoto et al. | 430/22 |
| 5,525,808 | 6/1996 | Irie et al. | 250/548 |
| 5,596,204 | 1/1997 | Irie et al. | 250/548 |

*Primary Examiner*—Frank G. Font
*Assistant Examiner*—Michael P. Stafira
*Attorney, Agent, or Firm*—Armstrong, Westerman, Hattori, McLeland & Naughton

[57] ABSTRACT

The X-coordinate of an X-axis search alignment mark (GMX) on a wafer (6) and the Y-coordinates of Y-axis search alignment marks (GMY1 and GMY2) on the wafer (6) are measured by laser step alignment (LSA) method, and the results of the measurement are processed to calculate approximate array coordinates of shot areas (ES1 to ES21) on the wafer (6). Die-by-die alignment and exposure are initiated from the shot area (ES11) that is the closest to the center of the array of all search alignment marks by using a TTR and two-beam interference (LIA) type alignment sensor having a predetermined capture range. At a shot area to be subsequently exposed, the amount of positional displacement between the reticle and the wafer is made to fall within the capture range relative to the initial positional displacement, thereby enabling alignment of high accuracy.

12 Claims, 9 Drawing Sheets

PROJECTION EXPOSURE METHOD

BACKGROUND OF THE INVENTION

1. Field of the Invention

The present invention relates to a projection exposure method and apparatus for projecting a mask pattern onto a photosensitive substrate in the manufacture of semiconductor devices, for example. More particularly, the present invention relates to a projection exposure method and apparatus which are suitably applied to a process in which exposure is carried out with alignment being effected by the die-by-die alignment method using a TTR (Through-The-Reticle) type alignment sensor. The die-by-die alignment is a process in which alignment is effected for each of a plurality of chips (i.e., a plurality of shot areas) on a wafer.

2. Description of the Related Art

In the production of semiconductor devices, liquid crystal display devices, etc., by photolithography processes, a projection exposure system (a stepper, etc.) is used in which a pattern formed on a reticle as a mask is projected onto each shot area on a wafer (or a glass plate or the like), which is coated with a photosensitive material, through a projection optical system. In this regard, a semiconductor device, for example, is formed by transferring a multiplicity of circuit patterns onto a wafer in an overlaid multilayer structure by exposure processes. Therefore, when a circuit pattern for the second or later layer is to be projected onto the wafer, it is necessary to carry out highly accurate alignment of the reticle pattern with respect to each shot area on the wafer where a circuit pattern has already been formed by a preceding exposure process. That is, wafer alignment must be effected with high accuracy.

Alignment methods usable for the above-described purpose include a die-by-die alignment method in which alignment is effected for each shot area on a wafer without depending on the positioning accuracy of the wafer stage. According to the die-by-die alignment method, before exposure is executed for each shot area on a wafer, measurement is carried out for an amount of positional displacement between an alignment mark (wafer mark) attached to each shot area and a reticle-side alignment mark (reticle mark) which corresponds to the wafer mark, and alignment is effected on the basis of the result of the measurement. The die-by-die alignment method is carried out by using a TTR (Through-The-Reticle) type alignment sensor which directly measures an amount of positional displacement between the corresponding wafer and reticle marks through the projection optical system and the reticle.

A two-beam interference type alignment sensor such as that disclosed in U.S. Pat. No. 5,489,986 (corresponding to Japanese Patent Unexamined Publication (KOKAI) No. 2-227602) is suitably used as a TTR type alignment sensor in the die-by-die alignment. The two-beam interference alignment method is also known as LIA (Laser Interferometric Alignment) method. According to a typical LIA method, a diffraction grating-shaped alignment mark on a wafer is illuminated by two beams of laser light from two different directions, and two diffracted light beams generated from the alignment mark are caused to interfere with each other. Thus, information concerning the position of the alignment mark, that is, an amount of positional displacement of the alignment mark, is detected on the basis of the phase of light formed by interference between the two diffracted light beams. There are two different types of LIA method: a heterodyne interference LIA method in which light formed by interference between two light beams of slightly different frequencies is detected; and a homodyne interference LIA method in which light formed by interference between light beams of the same frequency is detected. Usually, the heterodyne interference LIA method is used because it enables position detection to be effected in a stationary state.

A wafer mark and a reticle mark, which are objects to be detected by the LIA method, are diffraction grating marks each comprising diffraction grating patterns arranged at a predetermined pitch in the direction for measurement. A range in which accurate position detection can be effected with an LIA type alignment sensor, that is, a capture range, is in the range, for example, of ±¼ of the pitch P of the diffraction grating mark. Accordingly, when the amount of positional displacement between the wafer and reticle marks changes by an integer (n) multiple of P/2, which is the absolute width of ±¼ of P, the positional displacement Δ between the wafer and reticle marks which is measured with an LIA type alignment sensor shifts into other capture ranges for other diffraction grating marks which are sequentially adjacent to the capture range for the diffraction grating mark as the target of the position detection, and the positional displacement Δ is erroneously judged to be originally associated with the neighboring capture ranges. It is necessary in order to avoid such misjudgment to effect search alignment in advance so that the amount of positional displacement Δ between the wafer and reticle marks falls within, for example, the range of $-P/4 \leq \Delta < P/4$.

Conventionally, after the completion of the search alignment, die-by-die alignment and exposure are carried out for shot areas in order from one that lies at the edge of the wafer, for example. FIG. 14 shows the exposure sequence in the conventional process. In FIG. 14, a wafer 6 has shot areas ES1, ES2, . . . , ES21 regularly arranged thereon, and each shot area has been formed with a circuit pattern and a wafer mark. Upon completion of search alignment, die-by-die alignment and overlay exposure are initiated from the shot area ES1, which lies in a corner of the shot array at the edge of the wafer 6. Thereafter, the alignment and exposure process is carried out for the remaining shot areas in the order, ES2, ES3, ES4, . . . , ES20, and ES21, which are approximately adjacent to each other, as shown by the locus 74 in the figure.

As has been described above, the conventional practice is such that, in advance of the die-by-die alignment process, each shot area on the wafer is roughly positioned with respect to the exposure position by using search alignment marks so that the positional displacement Δ between the wafer mark and the corresponding reticle mark falls within the capture range ±P/4 of the LIA type alignment sensor. However, since the pitch P of the wafer mark is, for example, on the order of 10 μm (P=10 μm), the capture range ±P/4 as converted into a value on the wafer is a considerably small value, e.g., ±2.5 μm. Further, search alignment is effected on the basis of the result of measurement of two or three search alignment marks at the most by taking into consideration the throughput (the number of wafers processed per unit time). Therefore, the search alignment accuracy is likely to exceed the capture range. That is, the positional displacement Δ may become larger than ±P/4=±2.5 μm.

In a case where there is extremely large expansion or contraction in the wafer, the position of a shot area which is distant from the position of search alignment marks considerably deviates from the position obtained by the search alignment. In such a case, if die-by-die alignment is initiated from the shot area ES1 (see FIG. 14) which is considerably distant from the search alignment mark position, the amount of positional displacement at the shot area ES1 may also exceed the capture range. When the amount of positional displacement at the shot area ES1, from which alignment is started, exceeds the capture range for the shot area ES1, and it shifts into other capture ranges which are sequentially adjacent to the capture range for the shot area ES1, the alignment sensor detects this positional displacement as a value in each of the other capture ranges. As a result, an alignment error which is an integer multiple of the capture range arises.

In this regard, there is another alignment method known as "enhanced global alignment (EGA) method", in which a predetermined number of sample shots are selected from among shot areas on a wafer, and coordinate values of the sample shots are measured and statistically processed to thereby calculate array coordinates of each shot area. With the EGA method, it is possible to detect a sample shot in which the result of the measurement exceeds the capture range, for example, by obtaining a non-linear component of the array error, as disclosed, for example, in U.S. Pat. No. 4,780,617 (corresponding to Japanese Patent Unexamined Publication (KOKAI) No. 61-44429). However, when alignment is effected by the die-by-die alignment method using a TTR type alignment sensor, the throughput reduces unless exposure is carried out from the first shot area. Therefore, it is difficult to detect a shot area in which the measurement result exceeds the capture range by statistical processing as in the case of the EGA method.

SUMMARY OF THE INVENTION

An object of the present invention is to provide a projection exposure method and apparatus capable of reducing the probability that a positional displacement which is an integer multiple of a predetermined capture range will occur when alignment is effected by the die-by-die alignment method using an alignment sensor which detects an amount of positional displacement as a value in a predetermined capture range, thus enabling the alignment error to reduce as a whole.

The present invention provides a projection exposure method in which a pattern on a mask (4) and a shot area to be exposed on a substrate (6) are aligned with respect to one another by using an alignment sensor (1, 2 and 68) which measures an amount of positional displacement between at least one alignment mark (35A) on the mask (4) and at least one alignment mark (48A) attached to each shot area (ESi) on the substrate (6) as an amount of positional displacement in a predetermined capture range, and thereafter, the pattern of the mask (4) is transferred onto the shot area to be exposed. The projection exposure method has a first step (Step 102) of detecting positions of a plurality of search marks (GMX, GMY1 and GMY2) previously formed on the substrate (6) for effecting rough alignment of the substrate (6), and calculating approximate array coordinates of each shot area on the substrate (6) from the result of the detection.

Further, the exposure method has a second step (Steps 103 to 105) in which, after the shot area (ES11) that is closest to the center (positional centroid) of the array of the search marks (GMX, GMY1 and GMY2) on the substrate (6) has been positioned with respect to an exposure position for the pattern of the mask (4) on the basis of the array coordinates obtained in the first step, the mask (4) and the substrate (6) are moved relative to one another so that the amount of positional displacement between the mask (4) and the shot area (ES11) is within a predetermined tolerance by using the alignment sensor (1, 2 and 68), and in this state, the pattern of the mask (4) is transferred onto the shot area (ES11). The exposure method further has a third step (Steps 106 to 109) in which, in a state where another shot area (ES1 or ES16) on the substrate (6) has been positioned with respect to the exposure position for the pattern of the mask (4) on the basis of the array coordinates calculated in the first step, the mask (4) and the shot area (ES1) are aligned with respect to each other by using the alignment sensor (1, 2 and 68) such that the amount of relative movement of the mask (4) and the substrate (6) falls within the predetermined capture range relative to the amount of relative movement set in the second step, and then the pattern of the mask (4) is transferred onto the shot area (ES11).

In the third step, if the amount of relative movement of the mask (4) and the substrate (6) does not fall within the capture range relative to the amount of relative movement set in the second step as a result of the alignment of the mask (4) and the shot area (ES1) effected by using the alignment sensor (1, 2 and 68), the amount of relative movement should be changed, for example, by an integer multiple of the width CR of the capture range ±P/4 ( ... , −2·CR, −CR, CR, 2·CR, ... ) until the amount of relative movement falls within the capture range.

The third step may be such that a shot area (ES1 or ES16) which is away from the shot area (ES11) exposed in the second step by a distance not longer than the total width of three shot areas (in terms of the distance between the centers of the two shot areas ES11 and ES1 or ES16) is determined to be a shot area to be subsequently exposed, and thereafter, shot areas to be exposed are sequentially determined in such a manner that a shot area which is away from a shot area exposed immediately before it by a distance not longer than the total width of three shot areas is determined to be a shot area to be subsequently exposed, and that alignment for each shot area is effected on the basis of the amount of relative movement of the mask (4) and the substrate (6) at the shot area exposed immediately before it.

The third step may also be such that another shot area on the substrate (6) is positioned with respect to the exposure position for the pattern of the mask (4) on the basis of coordinates determined by correcting the array coordinates calculated in the first step by the amount of relative movement set in the second step, and that the mask (4) is set in the position assumed by the mask (4) before the alignment is effected in the second step, and thereafter, alignment is effected by using the alignment sensor.

It is desirable that the center of the array of the search marks (GMX, GMY1 and GMY2) on the substrate should be substantially coincident with the center of the substrate (6).

In addition, the present invention provides a projection exposure apparatus including: a substrate stage for mounting a substrate provided with a plurality of search alignment marks, a plurality of shot areas, and at least one first alignment mark which is provided in each of the shot areas; a mask stage for mounting a mask provided with at least one second alignment mark; a stage driving system for moving either one of the mask stage and substrate stage relative to the other; a laser step alignment (LSA) system for approximately obtaining array coordinates of the shot areas by illuminating the search alignment marks on the substrate with light; a laser interference alignment (LIA) system for detecting an amount of positional displacement between the first alignment mark on the substrate and the second alignment mark on the mask; and a central control system which controls the two alignment (LSA and LIA) systems and sequentially controls the stage driving system, whereby the central control system first cooperates with the laser step alignment (LSA) system to position the center of the array coordinates of a first shot area corresponding to the center of the array of the search alignment marks on the substrate with respect to an exposure center position of a projection optical system, and then the central control system cooperates with the laser step alignment (LSA) system to move the mask or the substrate relative to the other again until such an alignment complete state is reached that the amount of positional displacement between the first and second alignment marks falls within a predetermined capture range, thereby precisely effecting alignment for the first shot area.

In the alignment complete state, a pattern formed on the mask is projected onto the first shot area by exposure, and thereafter, the mask or the substrate is sequentially moved relative to the other, thereby sequentially effecting the above-described alignment for other shot areas, and while doing so, projection exposure is carried out for these shot areas.

That is, the present invention provides the following function and effects:

In the first step, array coordinates of a plurality of search marks (GMX, GMY1 and GMY2) are measured to effect search alignment, thereby determining, for example, approximate values of parameters for transformation from a coordinate system set on the substrate (6) into a coordinate system set in the exposure apparatus. Accordingly, array coordinates of each shot area on the substrate (6) in the coordinate system of the exposure apparatus are calculated from the design array coordinates of the shot area by using the determined transformation parameters, and each shot area can be roughly positioned with respect to the exposure position on the basis of the calculated array coordinates.

In this case, the array coordinates of the search marks (GMX, GMY1 and GMY2) can be accurately measured. Therefore, even if there is expansion or contraction in the substrate (6), array coordinates of the shot area (ES11) that is closest to the center (positional centroid) of the array of the search marks (GMX, GMY1 and GMY2) can be calculated with high accuracy by using the result of the search alignment because the central shot area (ES11) is less affected by the expansion or contraction of the substrate (6) than the shot areas lying at the edge of the substrate (6). Accordingly, when the central shot area (ES11) is positioned with respect to the exposure position during the die-by-die-alignment process, the probability that the amount of positional displacement between the alignment mark of the central shot area (ES11) and the corresponding alignment mark on the mask (4) will fall within the capture range of the alignment sensor (1, 2 and 68) is higher than in the case of the conventional alignment methods. Thus, the alignment error reduces.

In general, there is a small deviation in the positional relationship between the shot area (ES11) which is the first to be exposed on the substrate (6) and another shot area. Therefore, after a shot area which is to be exposed subsequently to the first shot area has been positioned with respect to the exposure position, the amount of relative movement of the substrate (6) and the mask (4) is set within the capture range relative to the amount of relative movement at the first central shot area, whereby, with regard to the shot area to be subsequently exposed also, there is a high probability that the amount of positional displacement between the alignment mark attached to that shot area and the corresponding alignment mark on the mask (4) will fall within the capture range of the alignment sensor (1, 2 and 68).

It should be noted that, after the shot area to be subsequently exposed has been positioned with respect to the exposure position, the mask (4) may be moved in order to control the amount of relative movement of the substrate (6) and the mask (4). Conversely, when the shot area is to be positioned with respect to the exposure position, the position of the substrate (6) may be corrected by a deviation of the amount of relative movement of the substrate (6) and the mask (4) from the initial amount of relative movement. Thereafter, at least either the position of the mask (4) or the position of the substrate (6) is adjusted according to the result of the detection carried out with the alignment sensor.

In these cases, if the center of the array of the search marks (GMX, GMY1 and GMY2) is previously set approximately in the center of the substrate (6), the distance between a shot area (ES11) which is first exposed and a shot area which is subsequently exposed is less than about ½ of the width of the substrate (6) at the most. Therefore, even if there is expansion or contraction in the substrate (6), the positional displacement of another shot area relative to the first shot area substantially falls within the capture range. Accordingly, shot areas over the whole surface of the substrate (6) can be aligned with high accuracy by, first, roughly positioning a shot area to be subsequently exposed with respect to the exposure position, and setting an amount of relative movement of the mask (4) and the substrate (6) such that it falls within the capture range relative to the amount of relative movement at the first shot area (ES11), and then effecting alignment using the alignment sensor (1, 2 and 68).

With the above-described method, however, if the displacement of a shot area due to the expansion or contraction of the substrate (6) or the rotation error of the substrate (6) (e.g., error in measurement of the rotation angle in search alignment) exceeds the capture range, an alignment error which is an integer multiple of the capture range arises. In order to reduce such an error, the distance between a shot area (ES11) which is first exposed and a shot area which is subsequently exposed should be not longer than the total width of three shot areas, and the distance between shot areas which are subsequently exposed should be not longer than the total width of three shot areas, more desirably not longer than the width of one shot area. Further, the amount of relative positional displacement of the substrate (6) and the mask (4) is controlled to fall within the capture range on the basis of the shot area exposed immediately before it. By doing so, it becomes possible to further increase the probability that the amount of positional displacement between the alignment mark of the relevant shot area and the corresponding alignment mark on the mask (4) will fall within the capture range of the alignment sensor (1, 2 and 68), and thus the alignment error reduces.

DESCRIPTION OF PREFERRED EMBODIMENTS

One embodiment of the exposure method according to the present invention will be described below with reference to the accompanying drawings. In this embodiment, the present invention is applied to an exposure process in which die-by-die alignment is effected in a stepper type projection exposure apparatus by using a TTR and heterodyne type two-beam interference type (LIA type) alignment sensor.

Figure 2:
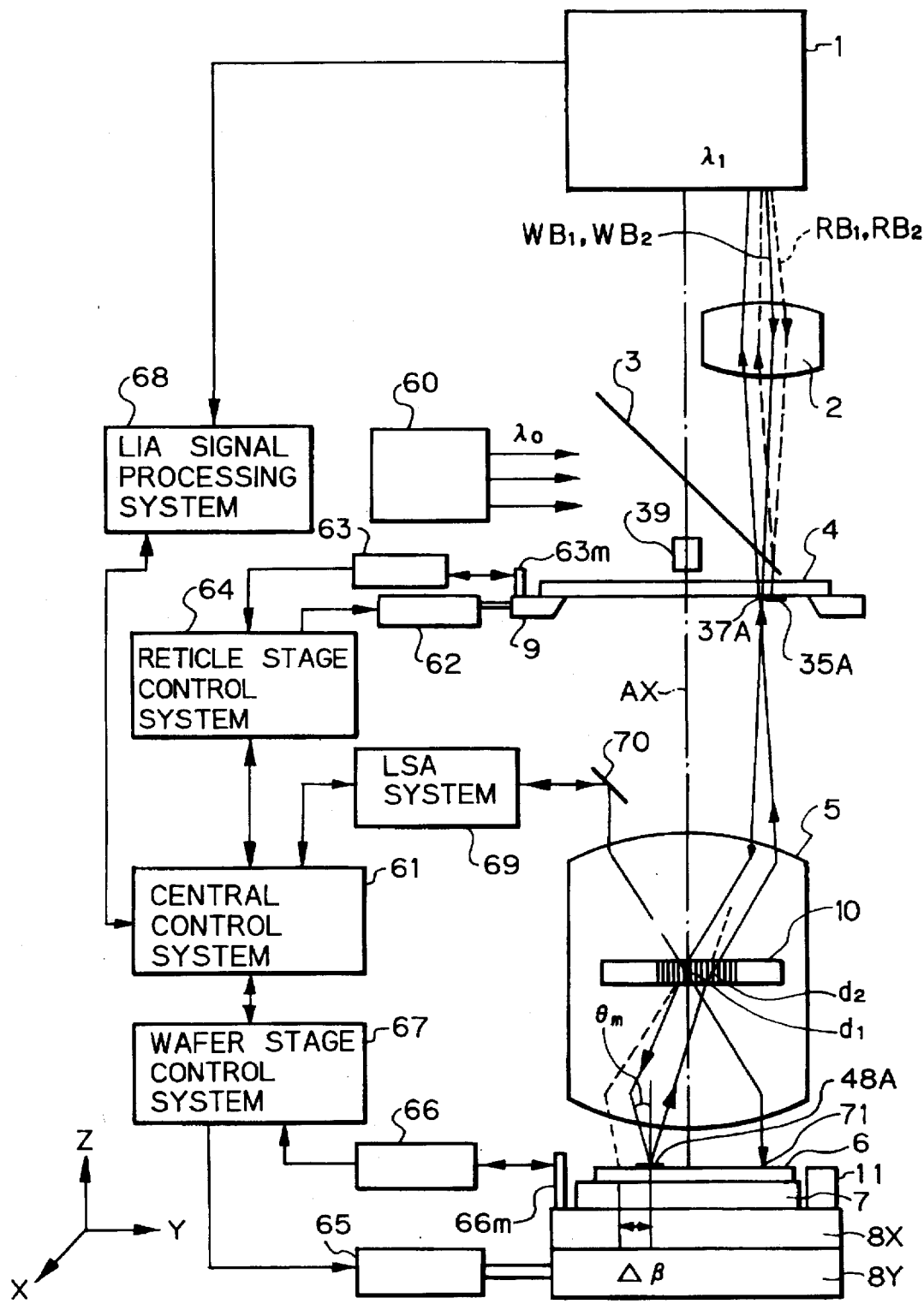
FIG. 2 schematically shows the whole arrangement of a projection exposure apparatus used in the embodiment of the present invention.

FIG. 2 schematically shows the whole arrangement of a projection exposure apparatus used in this embodiment. Referring to FIG. 2, during exposure, illuminating light of wavelength $\lambda_0$ for exposure is emitted from an exposure illumination system 60 and reflected by a dichroic mirror 3 to illuminate a reticle 4, and under the illuminating light, a pattern formed on the reticle 4 is projected through a projection optical system 5 onto each shot area on a wafer 6, which is coated with a photoresist, as an image reduced to 1/5, for example. As illuminating light for exposure, the i-line (wavelength: 365 nm) from a mercury-vapor lamp is used in this embodiment; however, it is also possible to use excimer laser light (wavelength: 248 nm, 193 nm, etc.). In the projection exposure apparatus, a Z-axis is taken in a direction parallel to an optical axis AX of the projection optical system 5. A Y-axis is taken in a direction parallel to the plane of FIG. 2 in a plane perpendicular to the Z-axis, and an X-axis is taken in a direction perpendicular to the plane of the FIG. 2.

The reticle 4 is held on a reticle stage 9. The reticle stage 9 effects positioning of the reticle 4 in the directions X and Y and rotation direction (θ) in a plane perpendicular to the optical axis AX of the projection optical system 5. The X- and Y-coordinates and rotation angle of the reticle stage 9 are constantly measured by a combination of a moving mirror 63m fixed on the reticle stage 9 and a laser interferometer 63 installed outside the reticle stage 9, and the measured values are supplied to a reticle stage control system 64. The measured values are also supplied through the reticle stage control system 64 to a central control system 61 which controls operations of the whole apparatus. When the central control system 61 supplies the reticle stage control system 64 with information concerning a target position and target rotation angle of the reticle stage 9, the reticle stage control system 64 sets the position and rotation angle of the reticle stage 9 to the respective target values through a reticle stage driving unit 62.

The wafer 6 is held on a wafer holder 7. The wafer holder 7 is mounted on a wafer stage comprising an X-stage 8X, a Y-stage 8Y, etc. In actuality, a Z-stage for positioning the wafer 6 in the direction Z is also mounted on the X-stage 8X. The wafer stage effects positioning of the wafer 6 in the directions X and Y and rotation direction (θ) in a plane perpendicular to the optical axis AX of the projection optical system 5. The X- and Y-coordinates and rotation angle of the wafer 6 are constantly measured by a combination of a moving mirror 66m fixed on the X-stage 8X and a laser interferometer 66 installed outside the wafer stage, and the measured values are supplied to a wafer stage control system 67. The measured values are also supplied to the central control system 61 through the wafer stage control system 67. When the central control system 61 supplies the wafer stage control system 67 with information concerning a target position and target rotation angle of the wafer 6, the wafer stage control system 67 controls the position and rotation angle of the wafer stage through a wafer stage driving unit 65.

Further, a fiducial mark member 11 is fixed on the X-stage 8X of the wafer stage at a position near the wafer 6. The fiducial mark member 11 has fiducial marks which are used as references during alignment of the reticle 4 with respect to the optical axis AX of the projection optical system 5. Two reticle alignment microscopes 39 and 40 (see FIG. 3) are disposed directly above the peripheral portion of the reticle 4 to detect an amount of positional displacement between alignment marks on the reticle 4 and the corresponding fiducial marks on the fiducial mark member 11. The results of detection made with the reticle alignment microscopes 39 and 40 are supplied to the central control system 61.

Next, an LIA type alignment sensor in this embodiment will be explained in detail. The alignment sensor comprises an objective lens 2 provided above the dichroic mirror 3, an alignment optical system 1 provided above the objective lens 2, and an LIA signal processing system 68. During alignment, a laser beam from a laser light source in the alignment optical system 1 is emitted as alignment light after being subjected to predetermined frequency modulation. Alignment light used in this embodiment is light in a band of wavelengths to which the photoresist coated on the wafer 6 is only slightly sensitive (e.g., a laser beam of wavelength 633 nm from a He—Ne laser light source). The alignment light passes through the objective lens 2 and the dichroic mirror 3 to illuminate a diffraction grating-shaped reticle mark 35A and a light-transmitting window (reticle window) 37A, which are provided on the reticle 4. Alignment light passing through the reticle window 37A illuminates a wafer mark 48A attached to a shot area on the wafer 6 which is to be positioned. In this embodiment, the direction for measurement of the reticle mark 35A and the wafer mark 48A is assumed to be the direction X.

A heterodyne beam generated by diffraction at the wafer mark 48A and a heterodyne beam generated by diffraction at the reticle mark 35A return to the alignment optical system 1 through the dichroic mirror 3 and the objective lens 2, and two beat signals are generated in a light-receiving system in the alignment optical system 1. The beat signals are supplied to the LIA signal processing system 68 where a phase difference between the two beat signals is detected, and the detected phase difference is supplied to the central control system 61.

Next, the optical path of alignment light from the LIA type alignment sensor in this embodiment, together with the method of detecting a reticle mark and a wafer mark, will be explained with reference to FIGS. 2 to 6. Referring to FIG. 2, the alignment optical system 1 emits a pair of reticle alignment illuminating light beams $RB_1$ and $RB_2$ and a pair of wafer alignment illuminating light beams $WB_1$ and $WB_2$, each pair of light beams having an average wavelength $\lambda_1$, which is different from the exposure wavelength $\lambda_0$, and a frequency difference $\Delta f$ (50 kHz in this embodiment).

Figure 3:
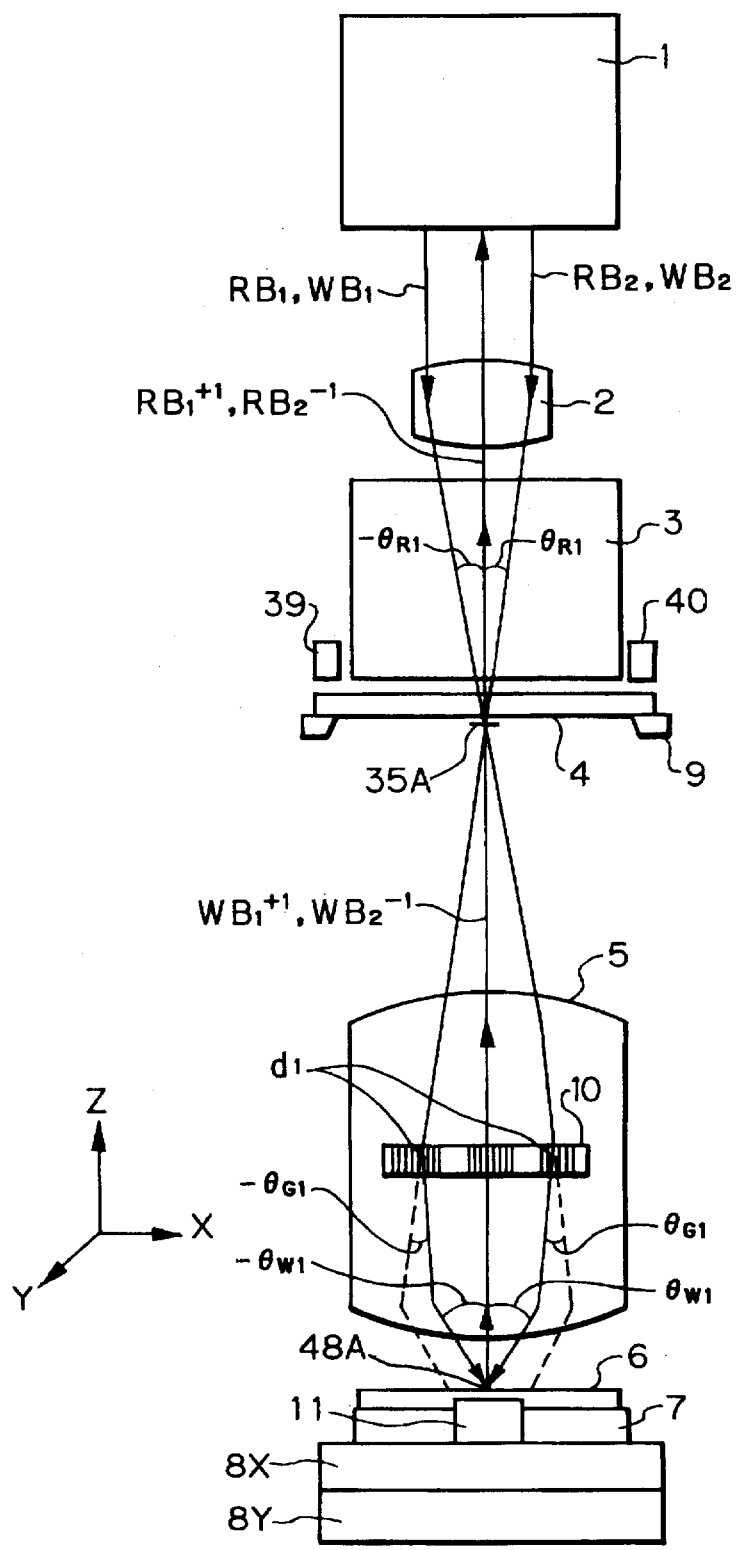
FIG. 3 is a side view of a stage system and an alignment optical system in the projection exposure apparatus shown in FIG. 2, as viewed in a direction Y in FIG. 2.

FIG. 3 is a side view of the arrangement shown in FIG. 2, as viewed in the direction Y in FIG. 2. As shown in FIG. 3, the reticle alignment illuminating light beams $RB_1$ and $RB_2$ are converged on the reticle 4 by the objective lens 2 and applied to the diffraction grating-shaped reticle mark 35A, which is provided on the lower surface of the reticle 4, at respective incident angles $-\theta_{R1}$ and $\theta_{R1}$.

Figure 5:
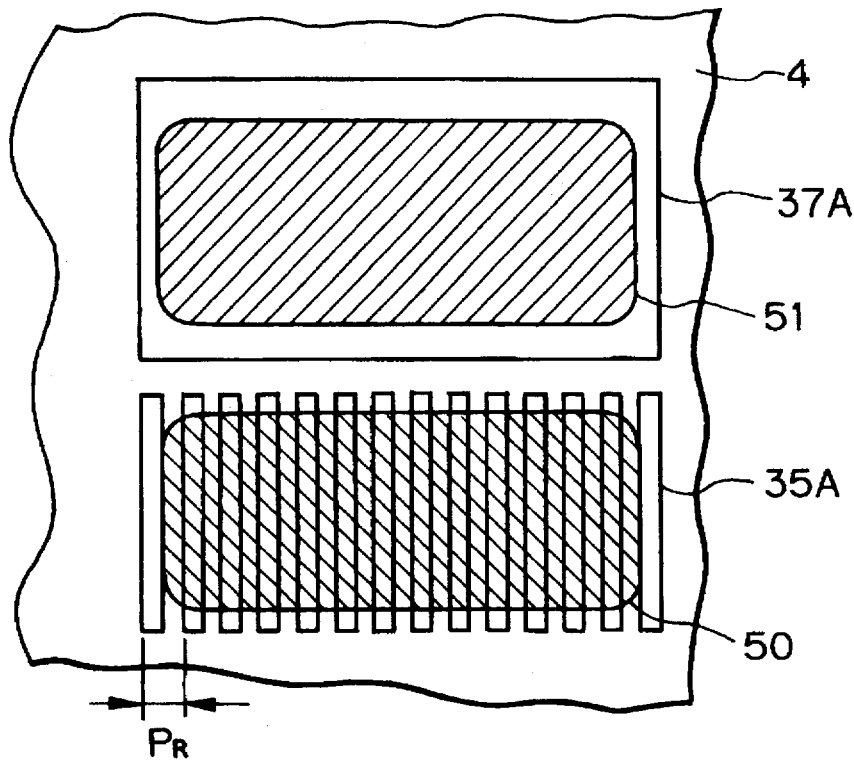
FIG. 5 is an enlarged plan view showing a reticle mark and a reticle window, which are formed on a reticle.

FIG. 5 is an enlarged view showing the reticle mark 35A and its vicinities on the reticle 4 in this embodiment. In FIG. 5, the reticle mark 35A for the X-axis is a mark comprising diffraction grating patterns formed at a pitch $P_R$ in the direction X. The reticle window 37A is provided inside the reticle mark 35A to pass alignment light directed toward the wafer side. A light beam 50 comprising the illuminating light beams $RB_1$ and $RB_2$ is applied to the reticle mark 35A, and a light beam 51 comprising the illuminating light beams $WB_1$ and $WB_2$ passes through the reticle window 37A.

Referring to FIG. 3, the incident angles $-\theta_{R1}$ and $\theta_{R1}$ and the grating pitch $P_R$ of the reticle mark 35A are related to each other as expressed by $$\sin \theta_{R1} = \lambda_1/P_R$$

Thus, +1st-order diffracted light beam $RB_1^{+1}$ of the illuminating light beam $RB_1$ and −1st-order diffracted light beam $RB_2^{-1}$ of the illuminating light beam $RB_2$ are generated from the reticle mark 35A to travel directly above it, and these diffracted light beams return to the alignment optical system 1 through the objective lens 2 as alignment detection light beams (heterodyne beams).

The wafer alignment illuminating light beams $WB_1$ and $WB_2$ pass through the reticle window 37A of the reticle 4 and reach a chromatic aberration control plate 10 in the projection optical system 5. The chromatic aberration control plate 10 has diffraction grating-shaped axial chromatic aberration control elements formed at portions $d_1$ where the illuminating light beams $WB_1$ and $WB_2$ pass. Thus, the illuminating light beams $WB_1$ and $WB_2$ are bent at respective angles $-\theta_{G1}$ and $\theta_{G1}$ and applied to the diffraction grating-shaped wafer mark 48A at respective incident angles $-\theta_{W1}$ and $\theta_{W1}$.

Figure 6:
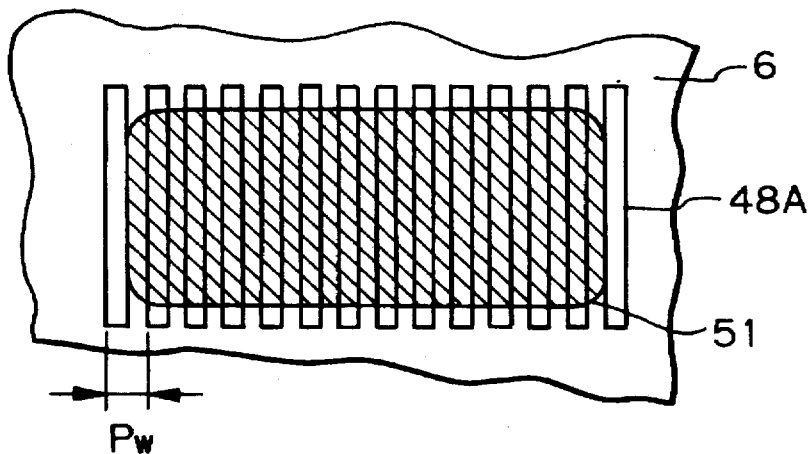
FIG. 6 is an enlarged plan view showing a wafer mark attached to a shot area on a wafer.

FIG. 6 is an enlarged view of the wafer mark 48A. In FIG. 6, the wafer mark 48A comprises recess-and-projection diffraction grating patterns formed at a pitch $P_W$ in the direction X. The wafer mark 48A is illuminated by the light beam 51 comprising the illuminating light beams $WB_1$ and $WB_2$. Referring to FIG. 3, the incident angles $-\theta_{W1}$ and $\theta_{W1}$ and the grating pitch $P_W$ of the wafer mark 48A are related to each other as expressed by $$\sin \theta_{W1} = \lambda_1/P_W$$

Thus, +1st-order diffracted light beam $WB_1^{+1}$ of the illuminating light beam $WB_1$ and −1st-order diffracted light beam $WB_2^{-1}$ of the illuminating light beam $WB_2$ are generated from the wafer mark 48A to travel directly above it, and these diffracted light beams are used as alignment detection light beams (heterodyne beams).

In this case, as shown in FIG. 2, the wafer alignment illuminating light beams $WB_1$ and $WB_2$ are made incident on the wafer mark 48A of the wafer 6 at an inclination angle $\theta_m$ in the non-measuring direction (i.e., the direction Y) by the deflecting action of the chromatic aberration control plate 10. Therefore, the position $d_2$ at which each alignment detection light beam, which is diffracted light from the wafer mark 48A, passes through the chromatic aberration control plate 10 differs from the position $d_1$ at which the light beam passes through the chromatic aberration control plate 10 when it is incident on the wafer mark 48A. The alignment detection light from the wafer mark 48A is corrected for lateral chromatic aberration by passing through another axial chromatic aberration control element on the chromatic aberration control plate 10, and then travels toward the reticle window 37A. Thereafter, each detection light beam returns to the alignment optical system 1 through the reticle window 37A and the objective lens 2. The wafer alignment illuminating light beams $WB_1$ and $WB_2$ illuminate a position $D_1$ on the surface of the wafer 6 which is displaced by $\Delta\beta$ in the direction Y relative to a position which would be illuminated if the chromatic aberration control plate 10 is not provided.

Figure 4A:
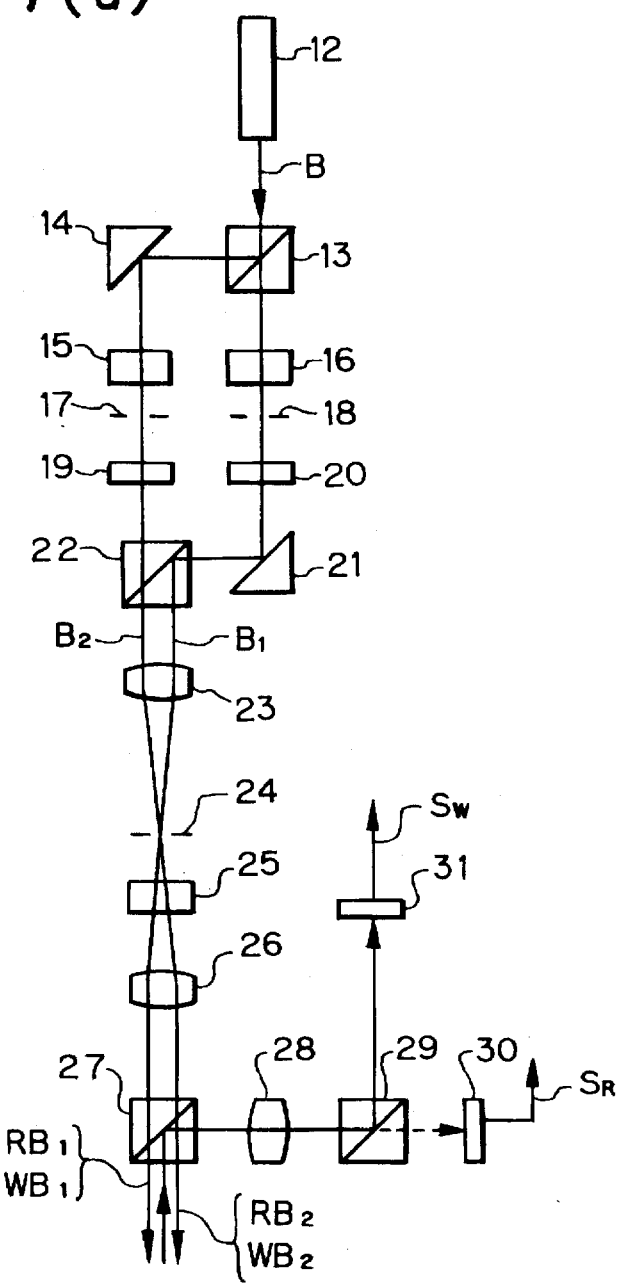
FIG. 4(a) shows the arrangement of the alignment optical system in FIG. 3.
Figure 4B:
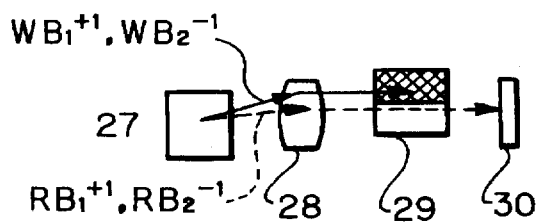
FIG. 4(b) is a bottom view of the arrangement shown in FIG. 4(a).

The alignment optical system 1 will be explained below in detail with reference to FIGS. 4(a) and 4(b). FIG. 4(a) shows the alignment optical system 1 as viewed from the same direction as in FIG. 3. FIG. 4(b) is a bottom view of the arrangement shown in FIG. 4(a). Referring to FIG. 4(a), a laser beam B emitted from a He—Ne laser light source 12 is split into two beams by a half-prism 13, and the two beams enter respective acousto-optic modulators (hereinafter referred to as "AOM") 15 and 16 which are driven at different frequencies $F_1$ and $F_2$. The frequencies $F_1$ and $F_2$ are each several tens of MHz, and the difference between the two frequencies is 50 kHz. Among diffracted light beams emitted from the AOMs 15 and 16, only +1st-order diffracted light beams $B_2$ and $B_1$ are extracted through slit plates 17 and 18. In the extracted +1st-order diffracted light beam $B_2$, a light beam passing through a half-prism 22 travels toward a converging lens 23. In the other +1st-order diffracted light beam $B_1$, a light beam reflected by the half-prism 22 travels toward the converging lens 23 in parallel to and slightly apart from the light beam passing through the half-prism 22.

The two light beams converged by the converging lens 23 are shaped by a field stop 24. The pair of light beams passing through the field stop 24 are split by a prism 25 into two pairs of light beams in a direction perpendicular to the plane of FIG. 4(a), thereby producing a pair of reticle alignment illuminating light beams $RB_1$ and $RB_2$ and a pair of wafer alignment illuminating light beams $WB_1$ and $WB_2$. The two pairs of alignment illuminating light beams are directed toward the objective lens 2, shown in FIG. 3, through a lens 26 and a half-prism 27.

The alignment detection light beams, which are diffracted light beams from the reticle mark 35A and the wafer mark 48A, shown in FIG. 3, return to the alignment optical system 1, shown in FIG. 4(a), in which the light beams are reflected by the half-prism 27 and enter a detection light separating prism 29 through a lens 28. The detection light separating prism 29 is placed at a position conjugate to both the reticle 4 and the wafer 6 to separate the alignment detection light beams into reticle detection light beams and wafer detection light beams. As shown in FIG. 4(b), the detection light separating prism 29 is a partially reflecting prism which reflects the wafer detection light beams but transmits the reticle detection light beams. The reticle detection light beams $RB_1^{+1}$ and $RB_2^{-1}$ pass through the detection light separating prism 29 and are received by a photoelectric detector 30. The wafer detection light beams $WB_1^{+1}$ and $WB_2^{-1}$ are reflected by the detection light separating prism 29 and received by a photoelectric detector 31 shown in FIG. 4(a). The photoelectric detector 30 outputs a reticle beat signal $S_R$ corresponding to the reticle mark position, and the photoelectric detector 31 outputs a wafer beat signal $S_W$ corresponding to the wafer mark position.

Figure 11:
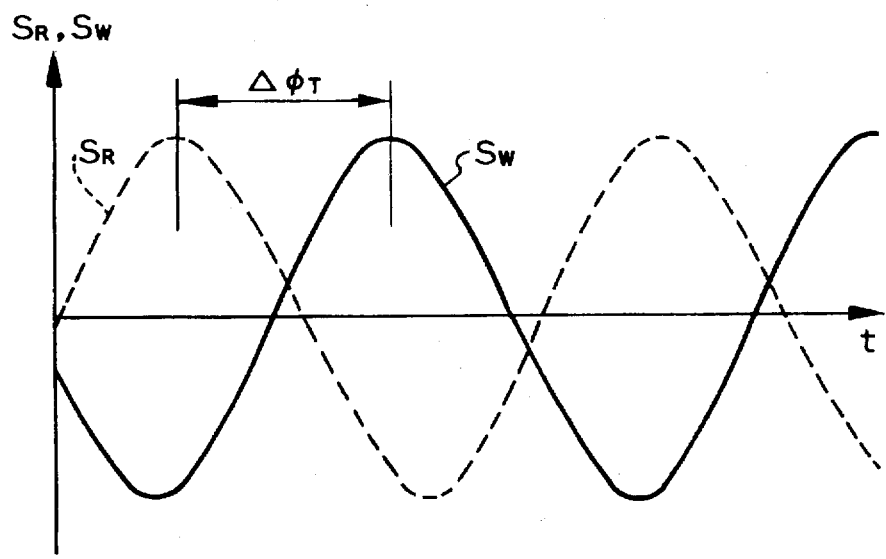
FIG. 11 is a waveform chart showing one example of a reticle beat signal and wafer beat signal output from an LIA type alignment optical system as shown in FIGS. 4(a) and 4(b).

FIG. 11 shows one example of the reticle beat signal $S_R$ and wafer beat signal $S_W$. The reticle and wafer beat signals $S_R$ and $S_W$ are sinusoidal beat signals each having a frequency $\Delta f$ (=50 kHz). The phase difference $\Delta\phi_T$ [rad] between these beat signals changes with the amount of relative movement in the direction X of the reticle 4 and the wafer 6. The amount of relative movement $\Delta x$ is given by $$\Delta x \text{(on the reticle)} = P_R \cdot \Delta\phi_T/(4\pi)$$

$$\Delta x \text{(on the wafer)} = P_W \cdot \Delta\phi_T/(4\pi)$$

It should be noted that what is determined by multiplying the reticle mark pitch $P_R$ by the projection magnification (demagnification) of the projection optical system 5, shown in FIG. 3, is the wafer mark pitch $P_W$. The capture range of the LIA type alignment sensor in this embodiment is in the range of from not less than $-P_R/4$ to less than $+P_R/4$ (herein referred to as "the range of $\pm P_R/4$") in terms of the displacement on the reticle 4. In terms of the displacement on the wafer 6, the capture range is in the range of from not less than $-P_W/4$ to less than $+P_W/4$ (referred to as "the range of $\pm P_W/4$"). Accordingly, the width of the capture range is $P_R/2$ in terms of the displacement on the reticle 4; it is $P_W/2$ in terms of the displacement on the wafer 6.

The reticle beat signal $S_R$ and the wafer beat signal $S_W$ are supplied to the LIA signal processing system 68, shown in FIG. 2, in which the phase difference $\Delta\phi_T$ between the two signals $S_R$ and $S_W$ is detected. The detected phase difference is supplied to the central control system 61. To effect die-by-die alignment, the central control system 61 adjusts the position of the reticle stage 9 through the reticle stage control system 64 so that the positional displacement between a pair of corresponding reticle and wafer marks becomes a predetermined target value on the basis of the phase difference $\Delta\phi_T$ between the two signals $S_R$ and $S_W$. In actual practice, LIA type alignment optical systems (not shown) for three axes are provided in addition to the above-described alignment optical system, and control is also effected with regard to the phase difference between two beat signals from each of the alignment optical systems for three axes so that a predetermined target value is reached. Thereafter, exposure is carried out to project the pattern image of the reticle 4 onto the relevant shot area on the wafer 6.

As shown in FIG. 2, a TTL (Through-The-Lens) and laser step alignment (LSA) type alignment system (hereinafter referred to as "LSA system") 69 is disposed at a side of the projection optical system 5. The LSA system 69 is an alignment system for the X-axis. The projection exposure apparatus is also provided with an LSA system (not shown) for the Y-axis. In this embodiment, these LSA systems are used to detect a search alignment mark. The LSA system 69 for the X-axis emits a laser beam in a band of wavelengths to which the photoresist on the wafer 6 is only slightly sensitive. The laser beam is reflected by a mirror 70 so as to enter the projection optical system 5. The laser beam is converged through the projection optical system 5 onto the wafer 6 as a slit-shaped light spot 71 which is elongated in the direction Y.

Figure 12A:
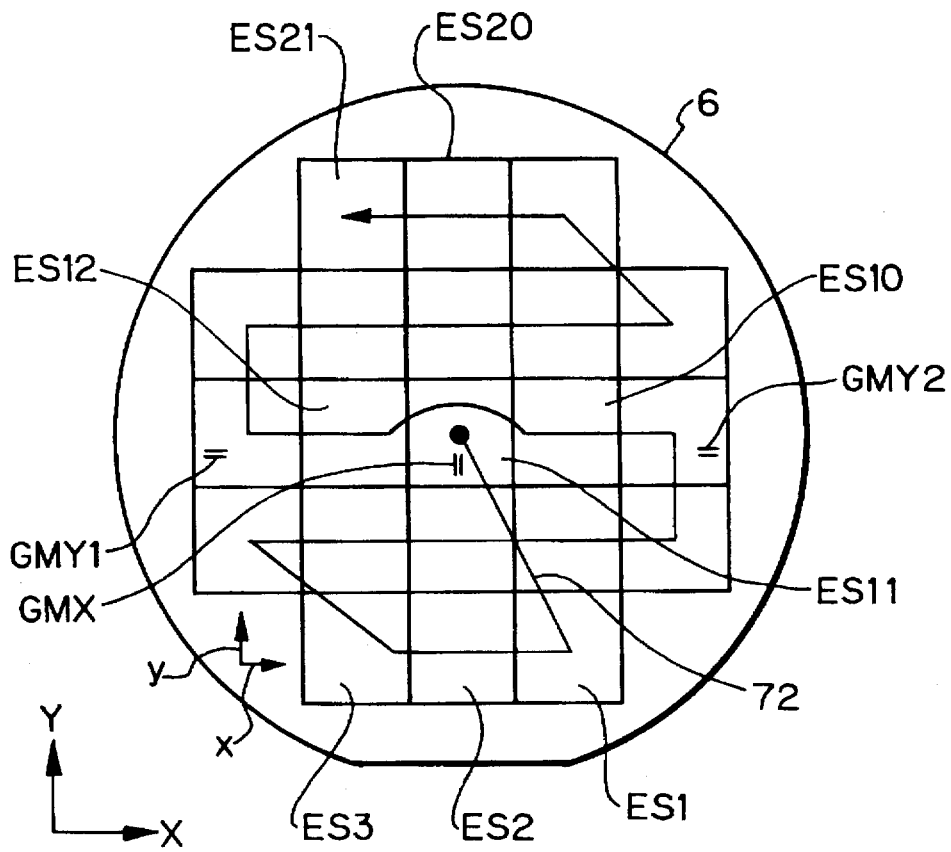
FIG. 12(a) is a plan view showing one example of the arrangement of shot areas on a wafer which are to be exposed in the embodiment and also showing one example of the arrangement of search alignment marks on the wafer.
Figure 12B:
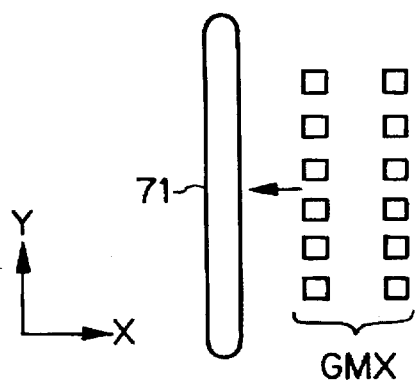
FIG. 12(b) illustrates the principle of detection of a search alignment mark.

FIG. 12(b) shows the light spot 71. As illustrated in the figure, an LSA type search alignment mark GMX for the X-axis lies in the vicinity of the light spot 71. The search alignment mark GMX comprises two rows of dot train-shaped patterns which are arranged in parallel in the direction Y. When the wafer stage is driven so that the search alignment mark GMX crosses the light spot 71, diffracted light is generated from the search alignment mark GMX such that the amount of diffracted light reaches a maximum as the search alignment mark GMX coincides with the light spot 71.

Referring to FIG. 2, the diffracted light generated from the search alignment mark GMX returns to the LSA system 69 through the projection optical system 5 and via the mirror 70 and is converted into an electric signal by a photoelectric detector in the LSA system 69. The electric signal is supplied to the central control system 61. The central control system 61 detects the X-coordinate of the search alignment mark GMX from the coordinate value of the wafer stage measured when the electric signal reaches a peak. Similarly, the Y-coordinate of a search alignment mark for the Y-axis is detected by using the LSA system (not shown) for the Y-axis.

Next, one example of an operation in which die-by-die alignment and exposure are carried out by the projection exposure apparatus according to this embodiment will be explained with reference to the flowchart of FIG. 1, together with FIGS. 7 to 12(b).

Figure 7:
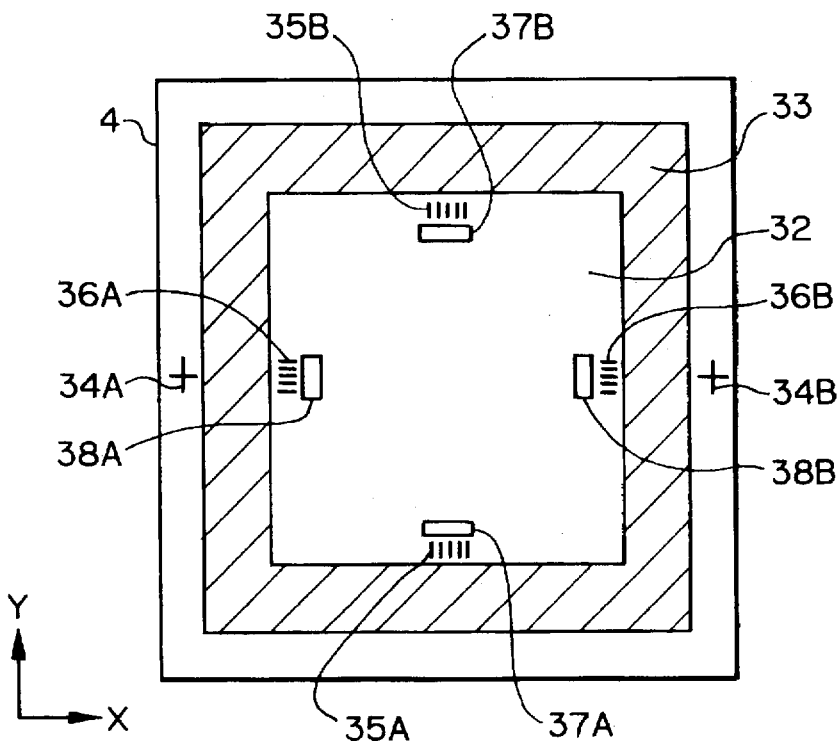
FIG. 7 is a plan view showing a pattern layout on a reticle used in the embodiment.

FIG. 7 shows a pattern layout on the reticle 4 used in this embodiment. In FIG. 7, the reticle 4 has a rectangular pattern area 32 on the lower side thereof. The pattern area 32 is defined inside a masking frame 33. A circuit pattern (not shown) to be transferred has been written in the pattern area 32. The pattern area 32 has a pair of diffraction grating-shaped reticle marks 35A and 35B and a pair of diffraction grating-shaped reticle marks 36A and 36B, which are provided near the four sides, respectively, of the pattern area 32. The reticle marks 35A and 35B each comprises diffraction grating patterns arranged at a predetermined pitch in the direction X, and the reticle marks 36A and 36B each comprises diffraction grating patterns arranged at a predetermined pitch in the direction Y. Reticle windows 37A, 37B, 38A and 38B are provided inside the reticle marks 35A, 35B, 36A and 36B, respectively. In addition, cross-shaped alignment marks 34A and 34B are provided so as to face each other across the masking frame 33 in the direction X.

Figure 8:
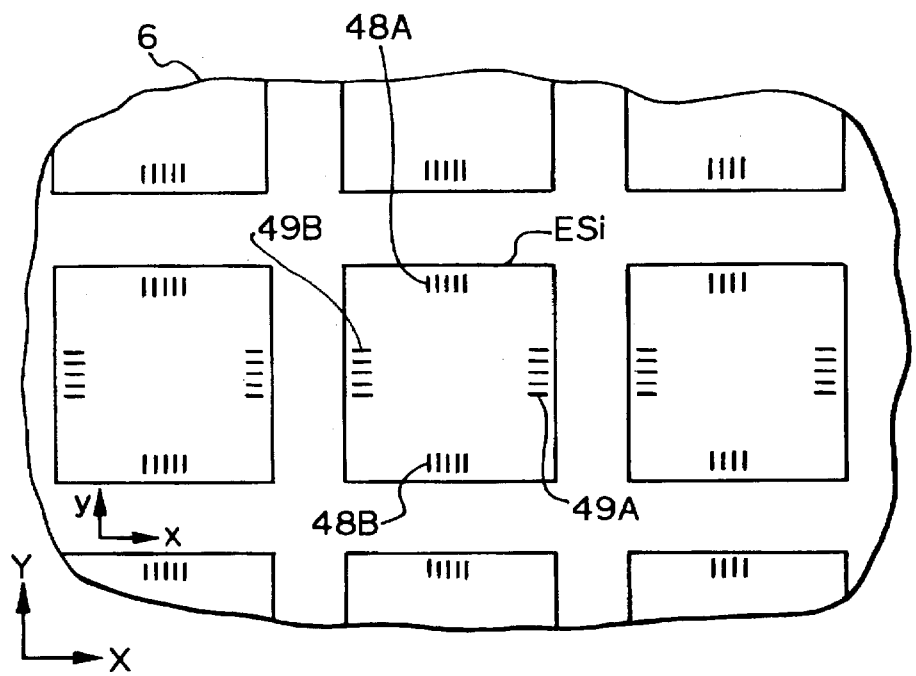
FIG. 8 is an enlarged plan view showing a part of shot areas on a wafer to be exposed in the embodiment.

FIG. 8 is an enlarged view of a part of shot areas on the wafer 6. In FIG. 8, a central rectangular shot area ESi has a pair of diffraction grating-shaped wafer marks 48A and 48B and a pair of diffraction grating-shaped wafer marks 49A and 49B, which are provided near the four sides, respectively, of the shot area ESi. The wafer marks 48A and 48B each comprises diffraction grating patterns arranged at a predetermined pitch in the direction X, and the wafer marks 49A and 49B each comprises diffraction grating patterns arranged at a predetermined pitch in the direction Y. Similarly, the other shot areas are each provided with a pair of wafer marks for the X-axis and a pair of wafer marks for the Y-axis. It should be noted that these wafer marks may be formed in street line areas lying between the shot areas.

Assuming that the shot area ESi is to be exposed, an amount of positional displacement between the wafer mark 48A and the corresponding reticle mark 35A, shown in FIG. 7, is detected by the alignment optical system 1, shown in FIG. 2, and amounts of positional displacement between the other three wafer marks 48B, 49A and 49B and the corresponding reticle marks 35B, 36A and 36B, shown in FIG. 7, are detected by other three alignment optical systems (not shown). The results of the detection are supplied to the central control system 61, shown in FIG. 2. That is, the positional displacement measured has 4 degrees of freedom. In contrast, the relative movement of the wafer 6 and the reticle 4 has 3 degrees of freedom (directions X, Y and θ). Therefore, for example, a mean value of the amounts of positional displacement measured for the two sets of marks for the X-axis is used for the positional displacement in the direction X, and a mean value of the amounts of positional displacement measured for the two sets of marks for the direction Y is used for the positional displacement in the direction Y. For the positional displacement in the direction θ, a mean value of the amounts of positional displacement measured for the four sets of marks for the X- and Y-axes is used. By doing so, averaging effect can be obtained.

Figure 9:
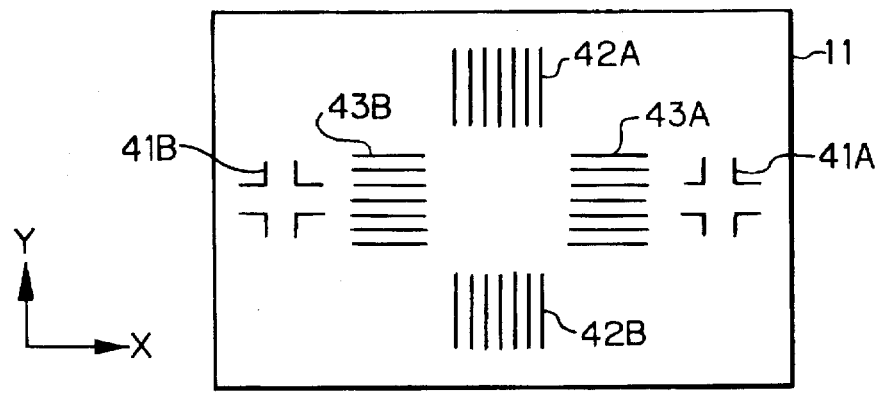
FIG. 9 is an enlarged plan view showing a pattern layout on a fiducial mark member provided on a wafer stage in the projection exposure apparatus shown in FIG. 2.

FIG. 9 shows a pattern layout on the fiducial mark member 11 (see FIG. 2) provided on the wafer stage in this embodiment. In FIG. 9, the fiducial mark member 11, which is made of a glass substrate, has frame-shaped fiducial marks 41A and 41B which are provided at a predetermined interval in the direction X. The distance between the fiducial marks 41A and 41B is set the same as a distance obtained by multiplying the distance between the alignment marks 34A and 34B on the reticle 4, shown in FIG. 7, by the projection magnification of the projection optical system 5. The fiducial marks 41A and 41B are illuminated from the bottom side toward the projection optical system 5 by illuminating light in the same wavelength band as the illuminating light for exposure. Between the fiducial marks 41A and 41B are provided reference diffraction grating marks 42A and 42B for the X-axis and reference diffraction grating marks 43A and 43B for the Y-axis, which are used as references in positioning of the wafer marks 48A, 48B, 49A and 49B.

Figure 1:
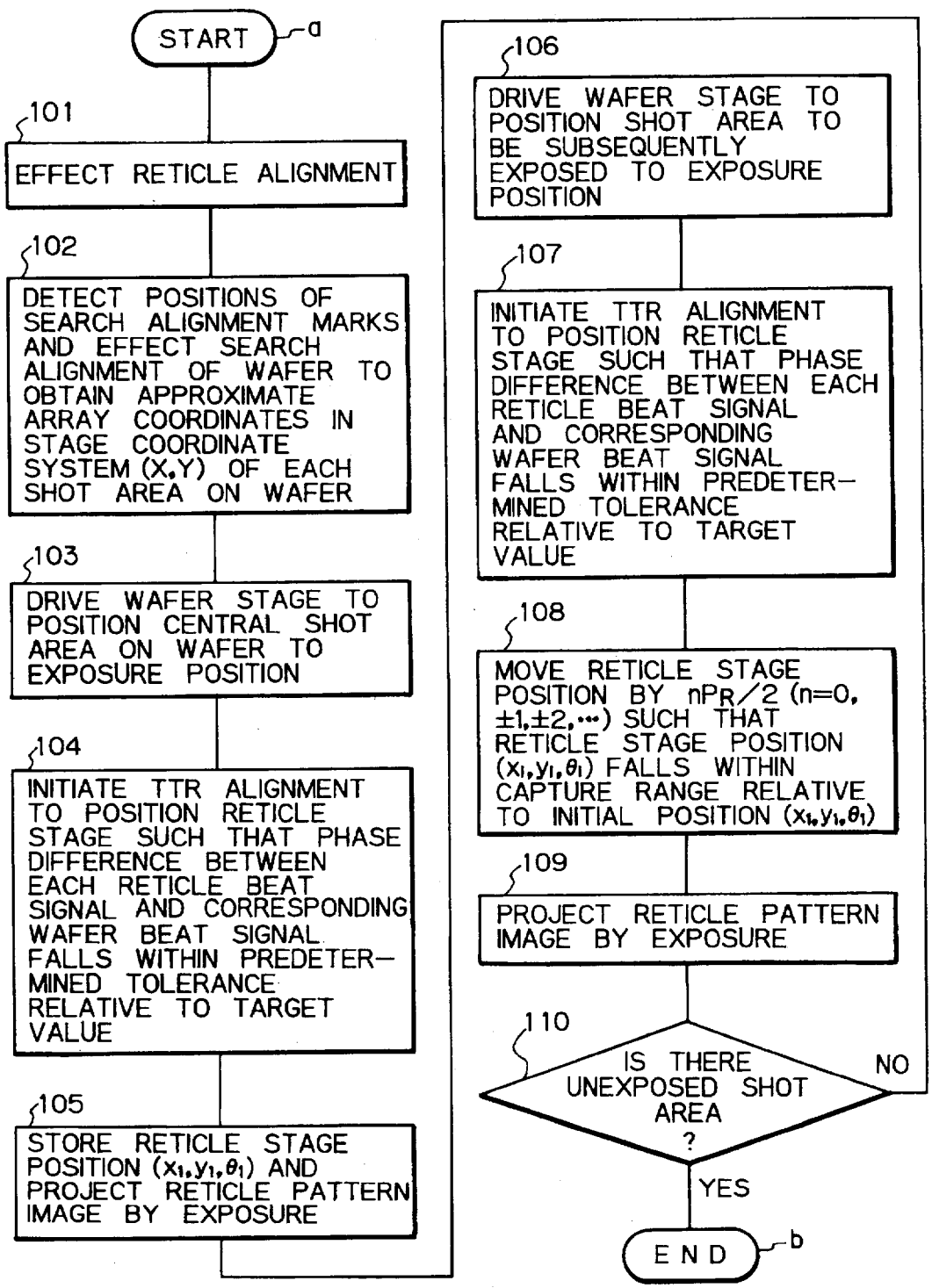
FIG. 1 is a flowchart showing one embodiment of the exposure method according to the present invention.

At Step 101 in FIG. 1, the reticle 4, shown in FIG. 2, is positioned with respect to the projection optical system 5 (i.e., reticle alignment is effected). More specifically, the central control system 61 drives the wafer stage (8X and 8Y) on the basis of data previously obtained so that the median point between the fiducial marks 41A and 41B of the fiducial mark member 11, shown in FIG. 9, coincides with the optical axis AX of the projection optical system 5. Thereafter, the central control system 61 captures imaging signals from the two reticle alignment microscopes 39 and 40, shown in FIG. 3.

Figure 10:
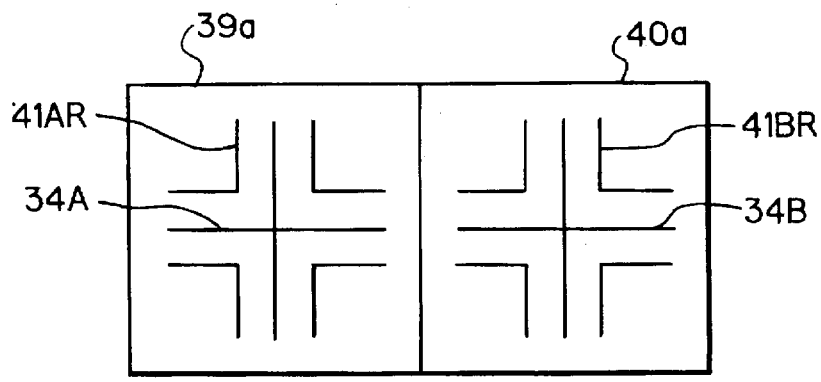
FIG. 10 shows visual fields of two reticle alignment microscopes.

FIG. 10 shows the visual fields 39a and 40a of the reticle alignment microscopes 39 and 40. In FIG. 10, an image 41AR of the fiducial mark 41A formed on the reticle 4 and the alignment mark 34A on the reticle 4 are observed in one visual field 39a, and an image 41BR of the fiducial mark 41B formed on the reticle 4 and the alignment mark 34B on the reticle 4 are observed in the other visual field 40a. The central control system 61, shown in FIG. 2, finely adjusts the position of the reticle stage 9 through the reticle stage control system 64, thereby positioning the reticle 4 in the directions X, Y and θ so that the centers of the alignment marks 34A and 34B coincide with the centers of the fiducial mark images 41AR and 41BR, respectively. It should be noted that, when the distance between the alignment marks 34A and 34B deviates from the design value, for example, the centers of the alignment marks 34A and 34B should be symmetrically displaced relative to the centers of the fiducial mark images 41AR and 41BR. Thus, the alignment of the reticle 4 is completed.

In a state where the reticle alignment has been completed as described above, the alignment optical system 1 of the LIA type alignment sensor, shown in FIG. 2, and the other three alignment optical systems are operated, and four sets of reticle beat signal $S_R$ and wafer beat signal $S_W$ [respectively output from the photoelectric detectors 30 and 31, shown in FIG. 4(a)] are taken into the LIA signal processing system 68. Phase differences $\Delta\phi_1$ to $\Delta\phi_4$ between the four sets of beat signals are stored in a storage unit in the LIA signal processing system 68 as target values. In this case, the phase difference $\Delta\phi_1$ between the two beat signals output from the alignment optical system 1 corresponds to the amount of positional displacement in the direction X between the reference diffraction grating mark 42A on the fiducial mark member 11, shown in FIG. 9, and the reticle mark 35A on the reticle 4, shown in FIG. 7. Similarly, the other phase differences $\Delta\phi_2$ to $\Delta\phi_4$ respectively correspond to the amounts of positional displacement between the reference diffraction grating marks 42B, 43A and 43B and the corresponding reticle marks 35B, 36A and 36B. The position of the reticle stage 9 after the completion of the reticle alignment is stored in the storage unit in the central control system 61 as an initial position. The initial position of the reticle stage 9 is defined by the X-coordinate $x_0$, the Y-coordinate $y_0$ and the rotation angle $\theta_0$, which are measured by the laser interferometer 63. Therefore, the initial position is expressed by $(x_0, y_0, \theta_0)$.

At the next Step 102, the wafer 6 to be exposed is loaded on the wafer stage, and search alignment is effected.

FIG. 12(a) shows one example of the arrangement of shot areas on the wafer 6 and also shows one example of the arrangement of search alignment marks on the wafer 6. In FIG. 12(a), the wafer 6 has a circular shape with a cut portion at its periphery. The wafer 6 has shot areas ES1, ES2 . . . , ES21 arrayed on its exposure surface at a predetermined pitch in each of two directions approximately parallel to the directions X and Y. Each shot area ESi (i=1 to 21) has four LIA type wafer marks provided as shown in FIG. 8. A search alignment mark GMX for the X-axis is provided at or near the center on the exposure surface of the wafer 6, and a pair of search alignment marks GMY1 and GMY2 for the Y-axis are provided so as to face each other across the search alignment mark GMX. As shown in FIG. 12(b), the search alignment mark GMX is a mark for the X-axis which is detected by the LSA method (see also the LSA system 69 in FIG. 2), and the search alignment marks GMY1 and GMY2 are marks for the Y-axis which are also detected by the LSA method.

In this embodiment, the median point between the Y-axis search alignment marks GMY1 and GMY2 lies in the vicinity of the center of the wafer 6, and the center of the array of the three search alignment marks GMX, GMY1 and GMY2 lies in the vicinity of the center of the wafer 6. The shot area ES11 is set so as to contain the wafer center and its vicinity. Assuming that a coordinate system (sample coordinate system) set on the wafer 6 is (x,y), the design array coordinates in the sample coordinate system (x,y) of the centers of all the shot areas on the wafer 6 and the three search alignment marks have previously been stored in the storage unit in the central control system 61.

Here, a coordinate system comprising X and Y coordinates measured by the wafer stage-side laser interferometer 66 of the projection exposure apparatus in this embodiment is defined as "stage coordinate system". Coordinate transformation from the design array coordinates (x,y) in the sample coordinate system into the array coordinates (X,Y) in the stage coordinate system is specified as given by the following expressions using three transformation parameters including rotation θ and offsets Ox and Oy. It should be noted that the following are approximate expressions based on the assumption that the rotation θ is small.

$$X = x - \theta \cdot y + Ox \quad (1A)$$

$$Y = \theta \cdot x + y + Oy \quad (1B)$$

In order to determine values of the three transformation parameters θ, Ox and Oy in the above expressions, the X-coordinate XM of the X-axis search alignment mark GMX, shown in FIG. 12(a), is measured by using the X-axis LSA system 69, shown in FIG. 2, and the Y-coordinates YM1 and YM2 of the Y-axis search alignment marks GMY1 and GMY2 are measured by using the Y-axis LSA system (not shown). Assuming that the design x-coordinate of the X-axis search alignment mark GMX in the sample coordinate system (x,y) is x1, and the design y-coordinates of the Y-axis search alignment marks GMY1 and GMY2 in the sample coordinate system (x,y) are y1 and y2, respectively, and that the measured distance in the direction X between the search alignment marks GMY1 and GMY2 is D, values of the three transformation parameters θ, Ox and Oy are determined, for example, as follows:

$$Ox = XM1 - x1 \quad (2A)$$

$$Oy = (YM1 + YM2)/2 - (y1 + y2)/2 \quad (2B)$$

$$\theta = \{(YM1 - YM2) - (y1 - y2)\}/D \quad (2C)$$

It should be noted that the distance (base line) from the detection center of the LSA system to the center of the exposure field of the projection optical system 5 has previously been obtained, and that values obtained by correcting the offsets Ox and Oy, given by the expressions (2A) and (2B), by the base line are values finally determined.

Next, the three transformation parameters determined as described above and the design array coordinates of the center of each shot area ESi (i=1 to 21) on the wafer 6 are substituted into the expressions (1A) and (1B), thereby calculating approximate array coordinates of each shot area ESi in the stage coordinate system (X,Y). However, the array coordinates calculated in this way have some deviation from the actual array coordinates due to expansion or contraction of the wafer 6 or a rotation error thereof. Therefore, it is necessary to effect final alignment using the LIA type alignment sensor. However, since the coordinates of the search alignment marks can be accurately measured, the array coordinates of a shot area close to the center of the array of the search alignment marks GMX, GMY1 and GMY2 can be calculated with high accuracy.

Then, the process proceeds to Step 103. At Step 103, first, the wafer stage is driven on the basis of the approximate array coordinates (i.e., the array coordinates calculated at Step 102) of a shot area that is the closest to the center of the array of the three search alignment marks GMX, GMY1 and GMY2 on the wafer 6, shown in FIG. 12(a), that is, the shot area S11 lying in the center of the wafer 6, thereby positioning the center of the shot area ES11 with respect to the center of the exposure field (i.e., exposure position) of the projection optical system 5.

Next, at Step 104, alignment is initiated by using the TTR and LIA type alignment sensor to measure beat signal phase differences $\Delta\phi_A$, $\Delta\phi_B$, $\Delta\phi_C$ and $\Delta\phi_D$ corresponding to the amounts of positional displacement between the four reticle marks 35A, 35B, 36A and 36B, shown in FIG. 7 and the four corresponding wafer marks in the shot area ES11. The LIA signal processing system 68 subtracts the target values $\Delta\phi_1$ to $\Delta\phi_4$, obtained at Step 101, from the measured phase differences $\Delta\phi_A$ to $\Delta\phi_D$ to obtain phase errors and supplies them to the central control system 61. In response to this, the central control system 61 positions the reticle stage 9 in the directions X, Y and θ through the reticle stage control system 64 such that the absolute value of a mean value of the two X-direction phase errors among the supplied phase errors becomes less than a predetermined first threshold value, and that the absolute value of a mean value of the two Y-direction phase errors becomes less than the first threshold value, and further that the sum of the absolute values of the four phase errors becomes less than a predetermined second threshold value. A state where positioning has been effected in this way is referred to as "alignment complete state".

Thereafter, at Step 105, the central control system 61 stores the position $(x_1,y_1,\theta_1)$ of the reticle stage 9 measured by the laser interferometer 63 in the abovedescribed alignment complete state into the internal storage unit, and activates the exposure illumination system 60 to project the pattern image of the reticle 4 onto the shot area ES11.

Thereafter, the process proceeds to Step 106. At Step 106, a shot area which is to be subsequently exposed is positioned with respect to the exposure position on the basis of the approximate array coordinates obtained at Step 102. A shot area to be subsequently exposed may be selected from any desired position on the wafer 6. However, the shot area ES1 which is at an end of the shot array in the outer peripheral portion of the wafer 6 is selected as a shot area to be subsequently exposed, as shown in FIG. 12(a). Then, at Step 107, the reticle stage 9 is positioned by effecting alignment using the TTR and LIA type alignment sensor in the same way as at Step 103. The position of the reticle stage 9 measured by the laser interferometer 63 in the alignment complete state is denoted by $(x_i,y_i,\theta_i)$.

Next, at Step 108, if the amount of change of the position $(x_i,y_i,\theta_i)$ of the reticle stage 9 in the alignment complete state relative to the initial position $(x_1,y_1,\theta_1)$, obtained at Step 104, falls within the capture range ($\pm P_R/4$ on the reticle 4) of the LIA type alignment sensor in all the directions X, Y and θ, the process proceeds to Step 109 at which the pattern image of the reticle 4 is projected onto the shot area ES1. In this case, the amount of change in the direction θ may be expressed, for example, by $d(\theta_i-\theta_1)/2$, where d is the distance in the direction X between the reticle marks 38A and 38B in FIG. 7. However, if it is found at Step 108 that the amount of change of the position $(x_i,y_i,\theta_i)$ of the reticle stage 9 in the alignment complete state relative to the initial position $(x_1,y_1,\theta_1)$ does not fall within the capture range in at least one of the directions X, Y and θ, the reticle stage 9 is driven to move the position of at least one of the reticle marks 35A, 35B, 36A and 36B on the reticle 4, shown in FIG. 7, in the measuring direction, by a distance equal to an integer multiple of the width of the capture range, i.e., $n \cdot P_R/2$ (n is an integer), so that the amount of change falls within the capture range. Even if a reticle mark is moved by a distance equal to an integer multiple of the capture range in this way, the value measured by the LIA type alignment sensor remains the same. Therefore, the phase difference detected by the alignment sensor falls within the tolerance relative to the target value. Then, at Step 109, exposure for the shot area ES1 is carried out.

Thereafter, it is judged at Step 110 whether or not there is an unexposed shot area. If there is an unexposed shot area, Steps 106 to 109 are repeated. As a result, exposure is sequentially carried out for the shot areas from the outer peripheral portion of the wafer 6 as shown by the locus 72 in FIG. 12(a), that is, in the order, ES1, ES2, ES3, ..., as far as ES21, with the first exposed shot area ES11 skipped. When exposure for all the shot areas is completed, the exposure process for the wafer 6 is terminated.

Thus, in this embodiment, the shot area ES11 that is closest to the center of the array of the search alignment marks GMX, GMY1 and GMY2 is first exposed at Step 103. In this case, since the array coordinates of the shot area ES11 have previously been obtained with high accuracy by the search alignment, there is an extremely high probability that the amount of positional displacement between each of the wafer marks 48 and 49 of the shot area ES11 and the corresponding reticle mark 35 or 36 will fall within the capture range of the LIA type alignment sensor in a state where the shot area ES11 has been positioned with respect to the exposure position. Accordingly, the probability that the shot area ES11 will be misaligned by a distance equal to an integer multiple of the capture range is extremely low. Thus, extremely high overlay accuracy can be obtained.

Further, in this embodiment, at each of the shot areas which are sequentially exposed after the first exposed shot area, the position $(x_i, y_i, \theta_i)$ of the reticle stage 9 is adjusted to fall within the capture range relative to the initial position $(x_1, y_1, \theta_1)$, as shown at Step 108. This can be done because there is a low probability that the amount of positioning error between different shot areas on the wafer 6 will exceed the capture range. Thus, it is possible to minimize the probability that a shot area which is to be subsequently exposed will be misaligned by a distance equal to an integer multiple of the capture range.

It should be noted that, in the above-described embodiment, the position $(x_1, y_1, \theta_1)$ of the reticle stage 9 when the first shot area ES11 is exposed is stored, and when the i-th shot area is to be exposed, the position $(x_i, y_i, \theta_i)$ of the reticle stage 9 is adjusted so as not to exceed the capture range of the LIA type alignment sensor relative to the position $(x_1, y_1, \theta_1)$. However, the system may be arranged such that a difference $(\Delta x_{01}, \Delta y_{01}, \Delta \theta_{01})$ between the position $(x_0, y_0, \theta_0)$ of the reticle stage 9 after the first shot area ES11 has been positioned with respect to the exposure position (Step 103 in FIG. 1) and before the TTR type alignment is initiated and the position $(x_1, y_1, \theta_1)$ of the reticle stage 9 upon completion of the alignment is obtained, and when exposure is to be carried out for a shot area following the first shot area ES11, the position of the wafer stage is shifted, when the shot area is positioned by the wafer stage (Step 106), so as to cancel a value obtained by multiplying the difference $(\Delta x_{01}, \Delta y_{01}, \Delta \theta_{01})$ by the projection magnification of the projection optical system 5. Thereafter, when the reticle stage 9 is positioned by using the TTR alignment sensor in correspondence to Steps 107 and 108, the position of the reticle stage 9 is adjusted so as not to exceed the capture range relative to the initial position $(x_0, y_0, \theta_0)$.

Next, another embodiment of the present invention will be described with reference to FIG. 13. The operation of this embodiment is the same as that of the first embodiment (see FIG. 12(a)) at Steps 101 to 105, shown in FIG. 1. The second embodiment differs from the first embodiment in the exposure sequence for shot areas.

Figure 13:
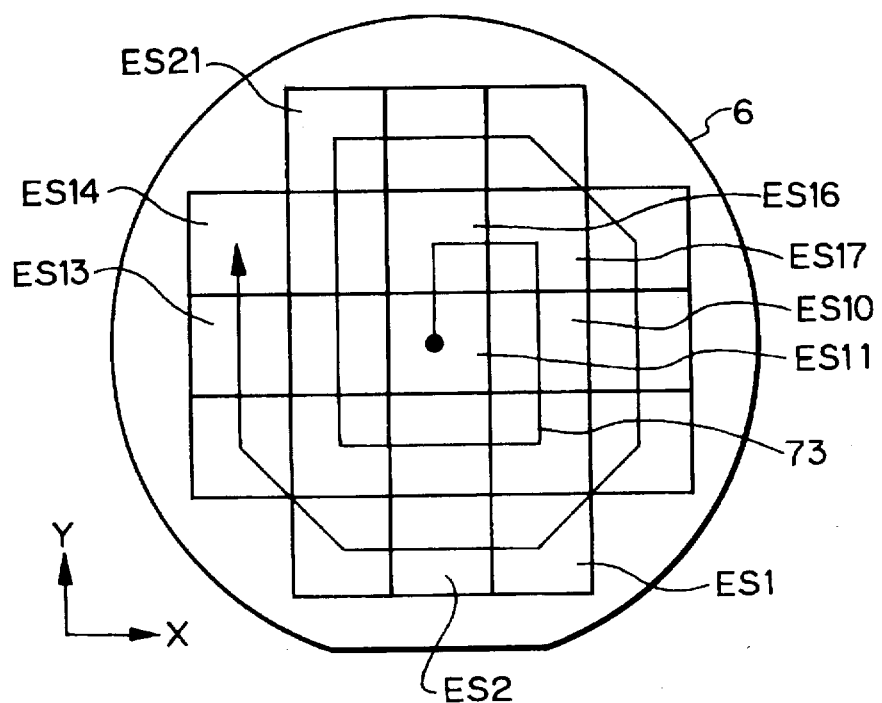
FIG. 13 is a plan view showing an exposure sequence for shot areas on a wafer in another embodiment of the present invention.
Figure 14:
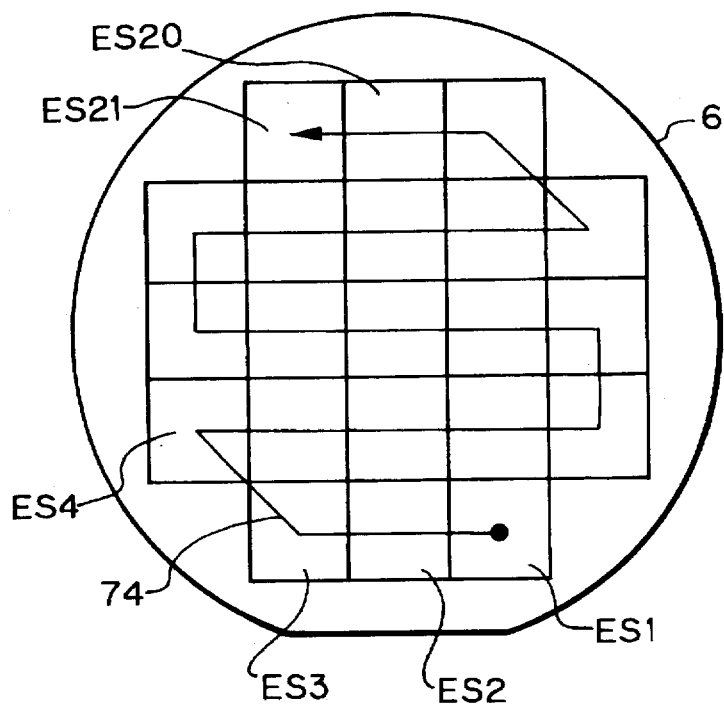
FIG. 14 is a plan view showing a conventional exposure sequence used in a case where exposure is carried out for each shot area on a wafer by effecting die-by-die alignment.

FIG. 13 shows the exposure sequence for the shot areas on the wafer 6 in this embodiment. In FIG. 13, the arrangement of shot areas on the wafer 6 and the arrangement of search alignment marks (not shown) on the wafer 6 are the same as those which are shown in FIG. 12(a). In this embodiment also, the central shot area WS11 on the wafer 6 is first subjected to projection exposure of the reticle pattern image. A shot area which is adjacent to the shot area exposed immediately before it in a sidewise or diagonal direction is selected as a shot area which is to be subsequently exposed. As a result, exposure is carried out for the shot areas in the order, ES11, ES16, ES17, ..., ES13, ES14, as shown by the spiral locus 73 in the figure.

In this embodiment, the position of the reticle stage 9 when alignment is to be initiated by using the TTR type alignment sensor in correspondence to Steps 107 and 108, shown in FIG. 1, is kept at the position of the reticle stage 9 when exposure was carried out for the shot area immediately before the present shot area. Thereafter, it is only necessary to position the reticle stage 9 such that a phase difference measured with each LSA type alignment sensor reaches the target value, because the probability that the amount of displacement in the layout of neighboring shot areas will exceed the capture range of the LSA type alignment sensor is extremely low even if the wafer 6 is considerably deformed (e.g., contracted). In this case, it is also unnecessary to read and store the position of the reticle stage 9 upon completion of the positioning.

It should be noted that, in the embodiment shown in FIG. 13, exposure is carried out for shot areas which are sequentially adjacent to each other, and in this case the distance between the centers of a pair of adjacent shot areas is equal to the width of one shot area in a widthwise or diagonal direction. Accordingly, it may be said that the distance between each pair of adjacent shot areas successively exposed is equal to the width of one shot area. In actual practice, however, if the distance between a pair of shot areas which are successively exposed is not longer than the total width of three shot areas, for example, the alignment error can be satisfactorily reduced because the probability that the amount of displacement in the layout of the two shot areas will exceed the capture range is extremely low.

Although in the above-described embodiments an LIA type alignment sensor is used, it should be noted that the present invention is applicable to systems using any type of alignment sensor which detects an amount of positional displacement as a value in a predetermined capture range even when the positional displacement exceeds the capture range.

Thus, the present invention is not necessarily limited to the above-described embodiments, but may adopt various arrangements without departing from the gist of the present invention.

According to the present invention, when die-by-die alignment is effected by using an alignment sensor which detects an amount of positional displacement as a value in a predetermined capture range, exposure is initiated from a shot area in the center of the array of search marks, i.e., approximately in the center of the substrate, and a shot area which is to be subsequently exposed is subjected to final alignment on the basis of the first shot area. In this case, the position of the first shot area has been measured with considerably high accuracy by search alignment. Therefore, it is possible to minimize the probability that a positioning error which is an integer multiple of the capture range will occur. Accordingly, it is possible to reduce an alignment error (e.g., overlay error) as a whole.

Further, since a shot area which is first exposed lies approximately in the center of the substrate, the distance between the shot area and any other shot area is less than about ½ of the width of the substrate. Accordingly, even if there is expansion or contraction in the substrate, the probability that the amount of displacement in the layout of the two shot areas will exceed the capture range is extremely low. Therefore, the alignment error is minimized.

The third step may be as follows: A shot area which is away from the shot area exposed in the second step by a distance not longer than the total width of three shot areas is determined to be a shot area to be subsequently exposed, and thereafter, shot areas to be exposed are sequentially determined in such a manner that a shot area which is away from a shot area exposed immediately before it by a distance not longer than the total width of three shot areas is determined to be a shot area to be subsequently exposed, and that alignment for each shot area is effected on the basis of the amount of relative movement of the reticle and the substrate at the shot area exposed immediately before it. In this case, even if there is expansion or contraction in the substrate, the probability that the amount of displacement in the layout of the two neighboring shot areas will exceed the capture range is extremely low. Therefore, the alignment error is reduced.

The third step may also be such that another shot area on the substrate is positioned with respect to the exposure position for the pattern of the mask on the basis of coordinates determined by correcting the array coordinates calculated in the first step by the amount of relative movement set in the second step, and that the mask is set in the position assumed by the mask before the alignment is effected in the second step, and thereafter, alignment is effected by using the alignment sensor. In this case, the amount of movement of the mask side can be reduced, advantageously.

What is claimed is:

1. An exposure method in which a pattern on a mask and a shot area to be exposed on a substrate are aligned with respect to each other by using an alignment sensor which measure an amount of positional displacement between at least one alignment mark on said mask and at least one alignment mark attached to each shot area on said substrate as an amount of positional displacement in a predetermined capture range, and thereafter, the pattern of said mask is transferred onto said shot area to be exposed, said method comprising:

a first step of detecting positions of a plurality of search marks previously formed on said substrate for effecting rough alignment of said substrate, and calculating approximate array coordinates of each shot area on said substrate from the result of said detection;

a second step in which, after a shot area that is located at a substantially center position of the substrate so as to correspond to an array of said search marks on said substrate has been positioned with respect to an exposure position for the pattern of said mask on the basis of the array coordinates obtained in said first step, said mask and said substrate are moved relative to each other so that an amount of positional displacement between said mask and said shot area is within a predetermined tolerance by using said alignment sensor, and in this state, the pattern of said mask is transferred onto said shot area;

a third step in which, in a state where another shot area on said substrate has been positioned with respect to the exposure pattern for the pattern of said mask on the basis of the array coordinates calculated in said first step, a relative position between said mask and said another shot area are adjusted with respect to each other by using said alignment sensor such that an amount of relative movement of said mask and said substrate falls within said predetermined capture range relative to the amount of relative movement set in said second step; and a fourth step of transferring the pattern of said mask onto said shot area.

2. An exposure method according to claim 1, wherein, in said third step, a shot area which is away from the shot area exposed in said second step by a distance not longer than a total width of three shot areas is determined to be a shot area to be subsequently exposed, and thereafter, shot areas to be exposed are sequentially determined in such a manner that a shot area which is away from a shot area exposed immediately before it by a distance not longer than a total width of three shot areas is determined to be a shot area to be subsequently exposed, and alignment for each shot area is effected on the basis of the amount of relative movement of said mask and said substrate at the shot area exposed immediately before it.

3. An exposure method according to claim 1, wherein, in said third step, another shot area on said substrate is positioned with respect to the exposure position for the pattern of said mask on the basis of coordinates determined by correcting the array coordinates calculated in said first step by the amount of relative movement set in said second step, and said mask is set in the position assumed by said mask before the alignment is effected in said second step, and thereafter, alignment is effected by using said alignment sensor.

4. An exposure method according to claim 1, wherein the array of said plurality of search marks on said substrate is determined on the basis of a position of a center of said substrate.

5. A projection exposure method comprising the steps of:

approximately obtaining array coordinates of a plurality of shot areas on a substrate provided with a plurality of search alignment marks, said shot areas, and at least one alignment mark which is provided so as to correspond to said shot areas by effecting laser step alignment (LSA) with respect to said search alignment marks;

moving a center of the array coordinates of a first shot area located at a substantially center position of the substrate, so as to be positioned at an exposure center position of a projection optical system, on the basis of said obtained array coordinates of the plurality of shot areas;

detecting an amount of phase difference between at least one alignment mark provided on said mask and said at least one alignment mark on said substrate by laser interference alignment (LIA), and moving either one of said mask and substrate relative to the other until such an alignment complete state is reached that said amount of phase difference falls within a predetermined capture range, thereby precisely effecting alignment for said first shot area;

carrying out exposure to project a pattern formed on said mask onto said first shot area; and sequentially moving either one of said mask and substrate relative to the other to effect alignment for other shot areas sequentially, and while doing so, carrying out projection exposure for the shot areas.

6. A projection exposure method according to claim 5, wherein a shot area which is exposed subsequently to one shot area is one that is within a range of three shot areas from said one shot area.

7. An exposure method according to claim 1, wherein there are provided a plurality of said alignment sensors; and a relative movement of the mask and the substrate in said second step is performed on the basis of a mean value of a plurality of amounts of measurement values obtained by said plurality of alignment sensors.

8. An exposure method according to claim 1, wherein the capture range is defined so as to correspond to a pitch of said alignment marks which are provided corresponding to each of the shot areas on the substrate.

9. A semiconductor element produced by the exposure method according to claim 1.

10. An exposure method according to claim 5, wherein said steps of precisely effecting alignment for said first shot area and carrying out exposure to project the pattern formed on said mask onto said first shot area comprising the steps of:

effecting alignment for said another shot area by moving the mask and the substrate relative to the other; and comparing an amount of a relative movement of the mask and the substrate during said step of effecting alignment for said another shot area, with an amount with respect to said predetermined capture range.

11. An exposure method according to claim 10, wherein said step of effecting alignment for said another shot area is performed again, when it has been found that said amount of the relative movement of the mask and the substrate is larger than said predetermined capture range.

12. An exposure method according to claim 11, wherein said step of effecting alignment again for said another shot area is performed by moving said mask by said amount of the relative movement corresponding to said capture range.

* * * * *